(12) United States Patent
Lou

(10) Patent No.: US 6,399,482 B1
(45) Date of Patent: Jun. 4, 2002

(54) METHOD AND STRUCTURE FOR A CONDUCTIVE AND A DIELECTRIC LAYER

(75) Inventor: Chine-Gie Lou, Hsinchu Hsien (TW)

(73) Assignee: Worldwide Semiconductor Manufactoring Corp. (TW)

( * ) Notice: Subject to any disclaimer, the term of this patent is extended or adjusted under 35 U.S.C. 154(b) by 0 days.

(21) Appl. No.: 09/430,749

(22) Filed: Oct. 29, 1999

(30) Foreign Application Priority Data

Sep. 30, 1999 (TW) ..................................... 88116885 A

(51) Int. Cl.$^7$ ......................................... H01L 21/4763
(52) U.S. Cl. ...................................................... 438/636
(58) Field of Search ................................. 438/636, 633, 438/634, 624, 763, 780, 619, 421, 422, 692, 694

(56) References Cited

U.S. PATENT DOCUMENTS

| | | | | |
|---|---|---|---|---|
| 5,932,487 A | * | 8/1999 | Lou et al. | 438/692 |
| 6,010,955 A | * | 1/2000 | Hashimoto | 438/597 |
| 6,020,265 A | * | 2/2000 | Lou | 438/692 |
| 6,228,756 B1 | * | 5/2001 | Lee | 438/619 |

* cited by examiner

Primary Examiner—Howard Weiss
Assistant Examiner—(Vikki) Hoa B. Trinh

(57) ABSTRACT

A structure and method for conductive layer and inter-metal dielectric layer is disclosed. Firstly, a conductive layer and an anti-reflection coating layer are formed on a substrate. A photolithography and an etching is then carried out to form conductive structure. Dielectric spacers are then formed on the sidewalls of the conductive structure. An organic dielectric layer is coated on the semiconductor substrate and etched back with the anti-reflection coating layer as stopping layer. The anti-reflection coating layer is then removed. An inorganic dielectric layer and a dielectric cap layer are deposited on the conductive structure and the organic dielectric layer. The structure fabricated comprises a conductive layer formed on a substrate; dielectric spacers formed on the sidewalls of the conductive layer; an organic dielectric layer formed to fill the regions among the conductive layer; an inorganic dielectric layer formed on the conductive layer and the organic dielectric layer; a planarized cap layer formed on the inorganic dielectric layer.

27 Claims, 5 Drawing Sheets

METHOD AND STRUCTURE FOR A CONDUCTIVE AND A DIELECTRIC LAYER

FIELD OF THE INVENTION

The present invention relates to a semiconductor device and manufacture process, and more especially, to a structure and method for inter-metal dielectric layer using low dielectric constant organic dielectric material and low dielectric constant inorganic dielectric material.

BACKGROUND OF THE INVENTION

In the electric and semiconductor industry, dielectric materials are widely applied to the isolations for devices and conductive layers. One important application of the dielectric materials is the inter-metal dielectric layer among the multilevel-interconnect.

The inter-metal dielectric layer is formed among the multilevel-interconnect to provide electrical insulation. As the integrated circuit technology trends toward increase of the device density and decrease of the device size, the density of interconnects increases and the allowed areas for the insulation regions must be reduced. However, there are always parasitic capacitors existent between adjacent interconnect lines and between the adjacent interconnect layers. Typically, for a standard capacitor, the capacitance $C=k\epsilon_o A/d$, wherein A is the surface area of the conductive line, $\epsilon_o$ is the permittivity of vacuum, d and k are respectively the thickness and permittivity of the dielectric material employed. When the thickness d of the employed dielectric layer decreases, the capacitance C will increase, and the RC time delay will therefore increase. Because the signal transmitting time is proportional to the RC time delay, the increase of the capacitance will be harmful to device characteristics such as frequency response.

For the reason to lower the capacitance and to reduce the influence about parasitic capacitor to the integrated circuits, seeking substitutional materials to reduce the permittivity, that is, dielectric constant of the inter-metal dielectric layer, would be an appropriate way without change the circuit layout. Typical silicon oxide materials, such as silicon dioxide, boro silicate glass, (BSG), phospho silicate glass (PSG), boro-phospho silicate glass (BPSG), or tetra-ethyl-ortho-silicate-oxide (TEOS-oxide), are not ideal inter-metal dielectric layers for their high dielectric constants within the range of about 3.9 to 4.5. An appropriate substitutional material is the organic dielectric material, which has dielectric constant around 2.5. With such a low dielectric constant, the parasitic capacitance and the RC time delay can be substantially lowered.

Due to the spin-on coating method that are usually employed for the fabrication of the organic dielectric material, moisture is always found during the fabrication. Therefore, organic dielectric material can not be formed directly in contact with metal. There must be a liner oxide, which is typically a tetra-ethyl-ortho-silicate-oxide (TEOS-oxide) layer, formed between organic dielectric material and metal. In FIG. 1, a cross-sectional view illustrating a traditional structure of a semiconductor wafer with an inter-metal dielectric layer formed of organic dielectric material is shown. On semiconductor substrate 10 with metal line 12, liner oxide 14, organic dielectric layer 16, and cap layer 18 formed sequentially, a contact hole 20 is opened through the cap layer 18, the organic dielectric layer 16, and the liner oxide 14 to expose a portion of the metal line 12.

Although the parasitic capacitance can be reduced with above dielectric structure, another problem about thermal conductivity arises. Due to the poor thermal conductivity of the organic dielectric material, the heat generated by the metal line is hard to be diffused and transferred through the organic dielectric material, and therefore the reliability of the metal line is decreased. Furthermore, because the contact hole 20 passes through the organic dielectric layer 16, the released moisture will react upon the metal material deposited subsequently, and damage the electrical conductivity of the contact hole.

FIG. 2 depicts an improved structure of inter-metal dielectric layer, wherein the isolation within a conductive layer is formed of organic dielectric layer 16 and the isolation between different conductive layers is formed of cap layer 18. Typically, the isolation thickness between different conductive layers is much greater than that within a conductive layer. At the isolation region between different conductive layers, the parasitic capacitance is smaller, but the thermal conductivity has a greater influence. Therefore, in consideration of both parasitic capacitance and thermal conductivity, the structure shown in FIG. 2 can lower the parasitic capacitance within a conductive layer and improve the thermal conductivity of inter-metal dielectric layer.

However, in the structure shown in FIG. 2, the liner oxide 14 must serve as a stopping layer when the: organic dielectric layer 16 is etched back, in addition to serve as a isolation layer between the metal line 12 and the organic dielectric layer 16. To be the stopping layer, the liner oxide 14 must be formed with a considerable thickness to prevent from over etching and damage of the underlying metal line 12. Typically, the thickness employed for this liner oxide 14 is ranged of about 1000 to 1500 angstroms. The thick liner oxide will increase the parasitic capacitance within a conductive layer. As the semiconductor manufacture tends to increase density of device, the area allowed for the dielectric layer within a conductive layer is decreased day by day. The effect that the parasitic capacitance increased by the thick liner oxide will become more and more important.

SUMMARY OF THE INVENTION

The present invention proposes a novel structure and method for inter-metal dielectric layer using low dielectric constant organic material and low dielectric constant inorganic material. The parasitic capacitance can be decreased as the thermal conductivity is substantially kept. The present invention is to fabricate an inter-metal dielectric layer with low dielectric constant organic material providing isolation within a conductive layer and with low dielectric constant inorganic material providing isolation between different conductive layers.

Firstly, a conductive layer and an anti-reflection coating layer are formed in sequence on a semiconductor substrate. A photolithography and an anisotropic etching process are then carried out to pattern the conductive layer and the anti-reflection coating layer. An interconnecting structure with anti-reflection coating is thus formed. A dielectric liner is deposited on the substrate and then etched back. Dielectric spacers are thus formed on the sidewalls of the conductive layer and the anti-reflection coating layer.

Thereafter, an organic dielectric layer is coated on the semiconductor substrate and then etched back with the anti-reflection coating layer as stopping layer. The anti-reflection coating layer is then removed. An inorganic dielectric layer and a dielectric cap layer are deposited in sequence on the conductive layer, the dielectric spacers and the organic dielectric layer. A chemical mechanical polishing is carried out to planarize the dielectric cap layer. Finally, the inorganic dielectric layer and the dielectric cap layer are etched to form contact holes.

By implementing above processes, a structure of a conductive line with an inter-metal dielectric layer is fabricated. The structure comprises a conductive line formed on a semiconductor substrate; dielectric spacers formed on the sidewalls of the conductive line; an organic dielectric layer formed on the substrate and filling the regions among the conductive line; an inorganic dielectric layer formed on the conductive line, the dielectric spacers, and the organic dielectric layer; a planarized cap layer formed on the inorganic dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a novel structure and method for inter-metal dielectric layer using low dielectric constant organic material and low dielectric constant inorganic material as material. The parasitic capacitance can be decreased as the thermal conductivity is substantially kept. The method described here includes many standard processes well known in the art like photolithography, etching or chemical vapor deposition (CVD) which are not discussed in detail.

The subject of the present invention is to fabricate an inter-metal dielectric layer with low dielectric constant organic material providing isolation within a conductive layer and with low dielectric constant inorganic material providing isolation between different conductive layers. The present manufacture processes comprise the fabrication of the underlying conductive layer, which is regarded as an element of the present invention and also described in the following specification referring to FIG. 3 to FIG. 11.

Figure 1:
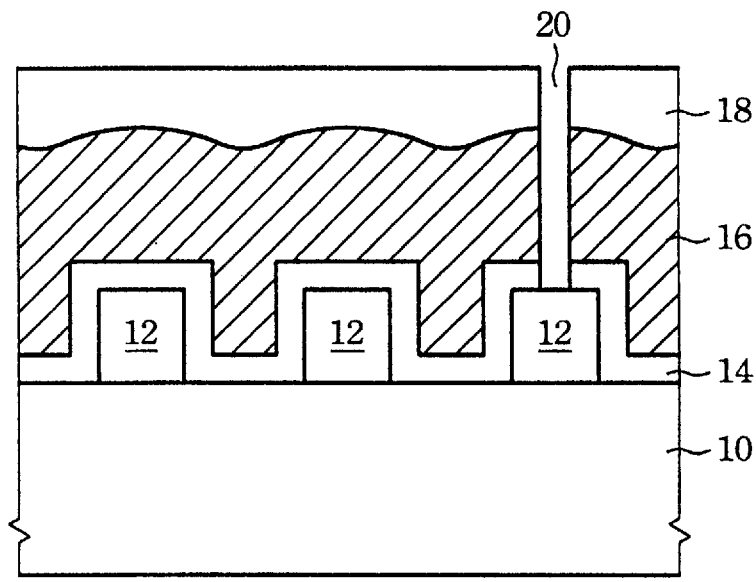
FIG. 1 is a cross-sectional view of a semiconductor wafer illustrating a inter-metal dielectric layer formed with organic dielectric material according to the prior art.
Figure 2:
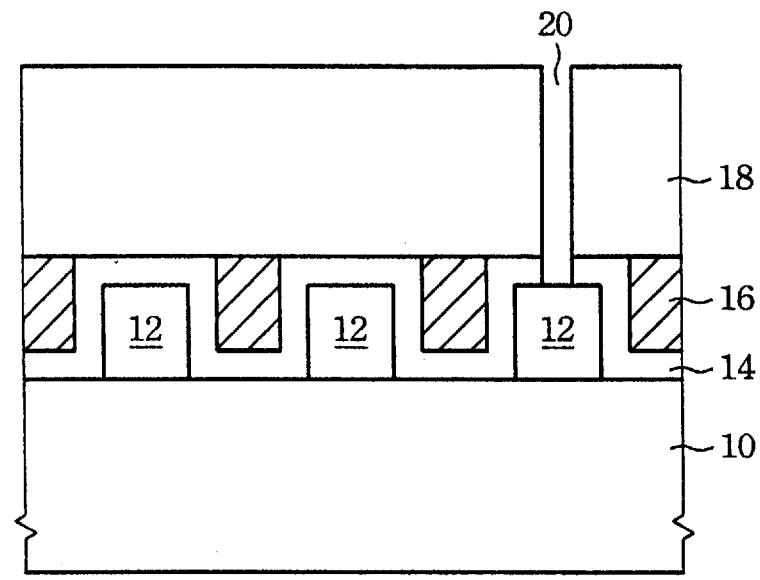
FIG. 2 is a cross-sectional view of a semiconductor wafer illustrating another case of a inter-metal dielectric layer formed with organic dielectric material according to the prior art.
Figure 3:
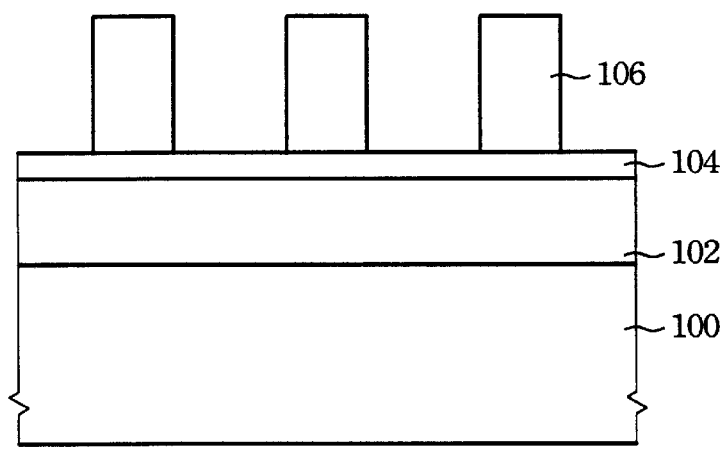
FIG. 3 is a cross-sectional view of a semiconductor wafer illustrating the step of forming a conductive layer and an anti-reflection coating layer on the substrate according to the present invention.

As shown in FIG. 3, a semiconductor substrate 100, wherein all the designed active-devices are built, is provided. Those active devices, such as transistors, resistors and capacitors, are not shown in the following figures for the cross-sectional view of the semiconductor substrate. Without limiting the spirit and the scope of the present invention, only the metallization processes and the profile of inter-metal layer are illustrated.

Firstly, on the semiconductor substrate 100, a conductive layer 102 is formed to serve as the electrodes of those designed active devices or an underlying interconnecting layer. The conductive layer 102 can be formed of conductive material such as metals or metal compounds. In the case, metals like aluminum (Al) or metal compounds like aluminum copper (AlCu) can be used. The metal or metal compound can be deposited with a chemical vapor deposition (CVD), or a physical vapor deposition (PVD). The thickness of the conductive layer 102 is determined according to the design rule and the requirement for the conductivity.

An anti-reflection coating (ARC) layer 104 is now formed on the conductive layer 102. The materials can be employed for this anti-reflection coating layer 104 includes silicon nitride and silicon oxynitride ($SiO_xN_y$). Silicon nitride and silicon oxynitride can be formed by chemical vapor deposition (CVD). In a preferred embodiment, silicon oxynitride (SiON) is a preferable material for this anti-reflection coating layer 104. The employment of this anti-reflection coating layer 104 can increase the precision of the subsequent exposure process due to the decrease of the reflection amount from the underlying metal layer 102. In the other way, the anti-reflection coating layer 104 can also serve as a stopping layer at later etching step. A thickness in the range of about 500 to 3000 angstroms is suitable.

Figure 4:
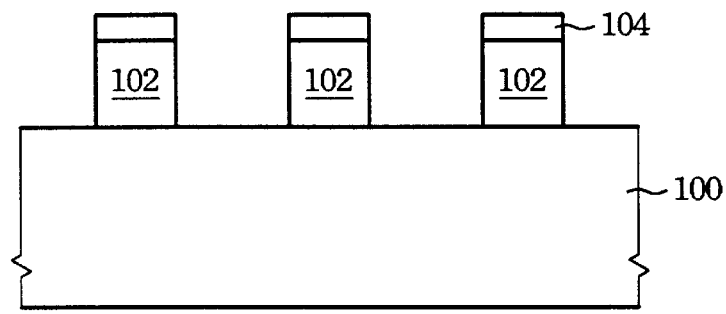
FIG. 4 is a cross-sectional view of a semiconductor wafer illustrating the step of patterning the conductive layer and the anti-reflection coating layer according to the present invention.

Next, a patterning process is carried out and a photoresist 106 with the pattern of the conductive layer 102 is defined on the anti-reflection coating layer 104, by using a conventional manner of photolithography including photoresist coating, exposure, and development processes. Then, a dry etching process is performed to etch the anti-reflection coating layer 104 and the conductive layer 102, and the portions uncovered by the photoresist 106 are removed. After photoresist is stripped and wet cleaned, a conductive structure with anti-reflection coating is formed as shown in FIG. 4, wherein a plurality of conductive regions are constructed with respective sidewalls.

Figure 5:
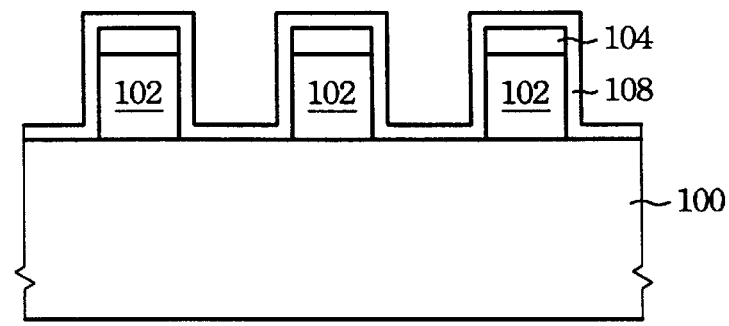
FIG. 5 is a cross-sectional view of a semiconductor wafer illustrating the step of forming a dielectric liner on the substrate according to the present invention.

Subsequently, a dielectric liner 108 is deposited on the semiconductor substrate 100, including the sidewalls of the conductive layer 102 as shown in FIG. 5. The dielectric liner 108 is usually formed by plasma enhanced chemical vapor deposition (PECVD) or high density plasma chemical vapor deposition (HDPCVD) with material selected from tetra-ethyl-ortho-silicate-oxide (TEOS-oxide), undoped silicate glass (USG), or silicon-rich oxide (SRO), and so on. With this dielectric liner 108, isolation between the conductive layer 102 and subsequent organic dielectric layer is provided. In a preferred embodiment, tetra-ethyl-ortho-silicate-oxide formed by plasma enhanced chemical vapor deposition (PE-TEOS) is employed for this dielectric liner 108, with a thickness in the range of about 300 to 500 angstroms.

Figure 6:
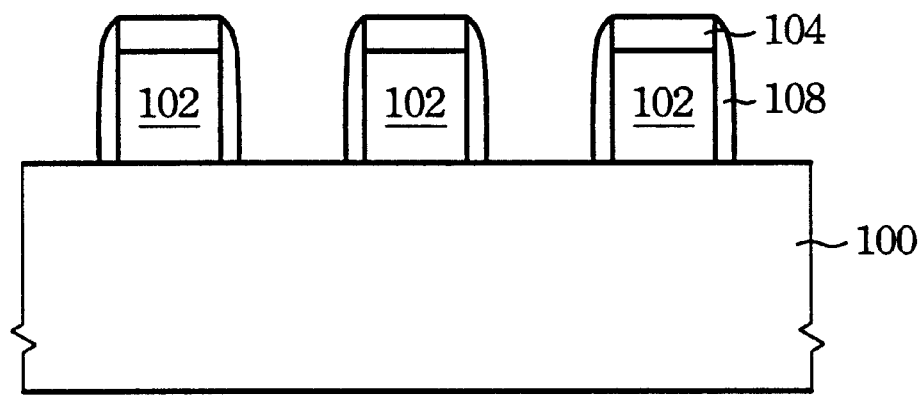
FIG. 6 is a cross-sectional view of a semiconductor wafer illustrating the step of etching back the dielectric liner to form dielectric spacers on the sidewalls of the conductive layer and the anti-reflection coating layer according to the present invention.

Referring to FIG. 6, an anisotropic etching process is performing to etch back the dielectric liner 108. At this step, the portion of the dielectric liner 108 over the anti-reflection coating layer 104 is removed. Dielectric spacers 108 are thus formed on the sidewalls of the conductive layer 102 and the anti-reflection coating layer 104. This anisotropic etching process can be carried out by using reactive ion etching (RIE) with plasma gases containing fluoride such as $CF_4$, $CHF_3$, $C_2F_6$ or $C_3F_8$. The thickness of the dielectric spacer 108 is formed in the range of about 200 to 500 angstroms, which is far smaller than that of the traditional liner.

Figure 7:
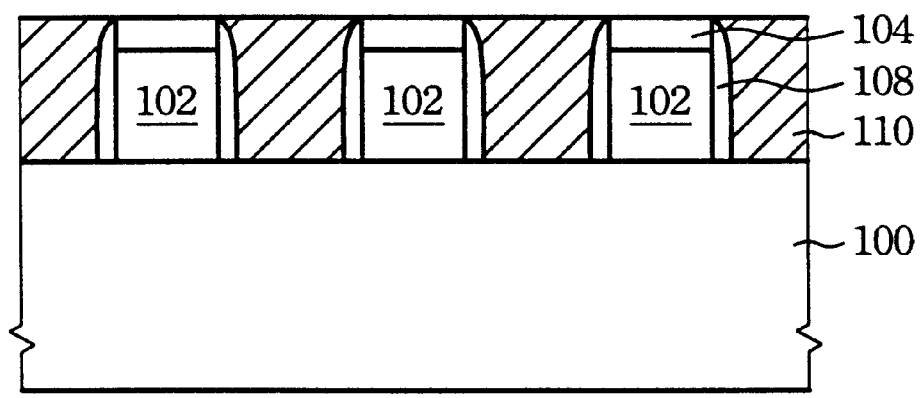
FIG. 7 is a cross-sectional view of a semiconductor wafer illustrating the step of forming an organic dielectric layer on the substrate according to the present invention.

After the dielectric spacer 108 is formed, the fabrication of the organic dielectric material is carried out. Typically, polymer is employed as material to form an organic dielectric layer 110 on the semiconductor substrate 100 with dielectric constant ranged of about 2 to 3. There are two steps in the fabrication of the organic dielectric layer 110. Firstly, organic dielectric layer is coated on the entire area of the semiconductor substrate 100 by a spin-on coating method. At this moment, the organic dielectric layer is filled between adjacent conductive regions and on the anti-reflection coating layer 104. Subsequently, a process for etching back is performed with the anti-reflection coating layer 104 as the stopping layer, and the portion of the organic dielectric layer excess the anti-reflection coating layer 104 is removed. The final cross-sectional view of the organic dielectric layer 110 is shown in FIG. 7. For the conductive layer 102, the adjacent conductive regions are isolated by the multi-layer of dielectric spacer 108/organic dielectric layer 110/dielectric spacer 108. Furthermore, because the dielectric spacers 108 exist only on the sidewalls of the conductive regions and have a thinner inconsiderable thickness, the parasitic capacitance is thus substantially reduced.

Figure 8:
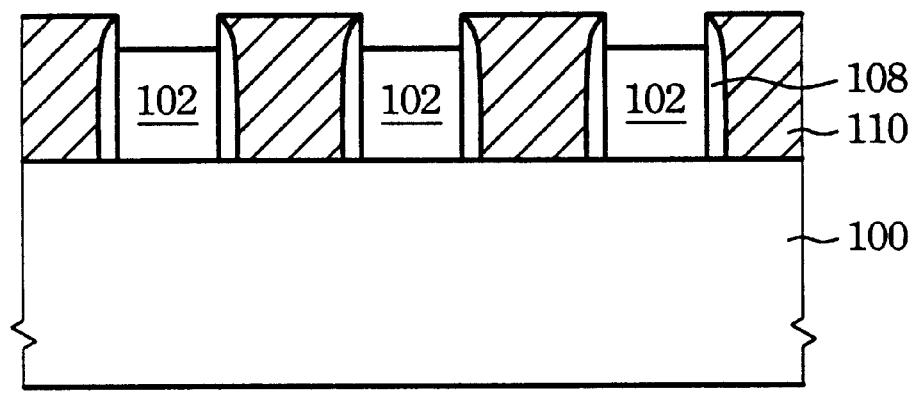
FIG. 8 is a cross-sectional view of a semiconductor wafer illustrating the step of removing the anti-reflection coating layer according to the present invention.

Turning next to FIG. 8, an etching step is performed to remove the anti-reflection coating layer 104 on the conductive layer 102 after the organic dielectric layer 110 is formed. In above preferred embodiment employed silicon oxynitride (SiON) as anti-reflection coating material, this etching process can be implemented by a wet etching using hot solution of phosphoric acid ($H_3PO_4$) as the etchant.

Figure 9:
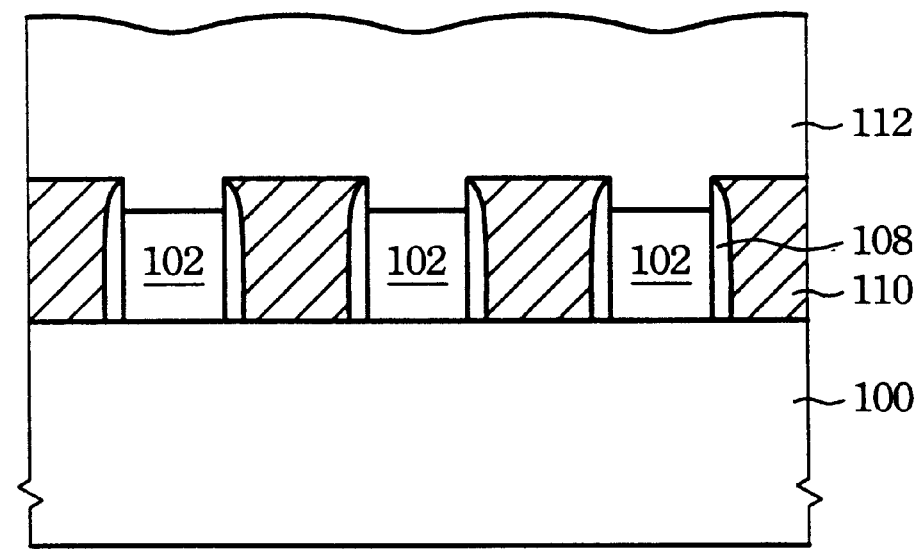
FIG. 9 is a cross-sectional view of a semiconductor wafer illustrating the step of forming an inorganic dielectric layer on the conductive layer, the dielectric spacers and the organic dielectric layer according to the present invention.

Thereafter, an inorganic dielectric layer 112 is deposited on the conductive layer 102, the dielectric spacer 108 and the organic dielectric layer 110 as shown in FIG. 9. The inorganic dielectric layer 112 has a dielectric constant typically in the range of about 3 to 3.8, and can be formed of fluorine-doped silicon oxide (or named fluorosilicate glass, FSG). Fluorine-doped silicon oxide (FSG) can be deposited by chemical vapor deposition such as HDPCVD.

Figure 10:
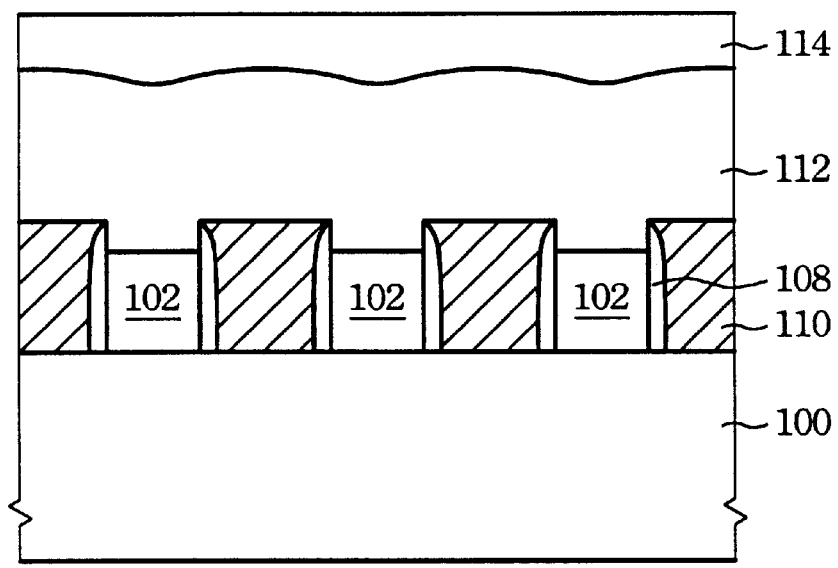
FIG. 10 is a cross-sectional view of a semiconductor wafer illustrating the step of forming a dielectric cap layer on the inorganic dielectric layer and performing a planarization process according to the present invention.
Figure 11:
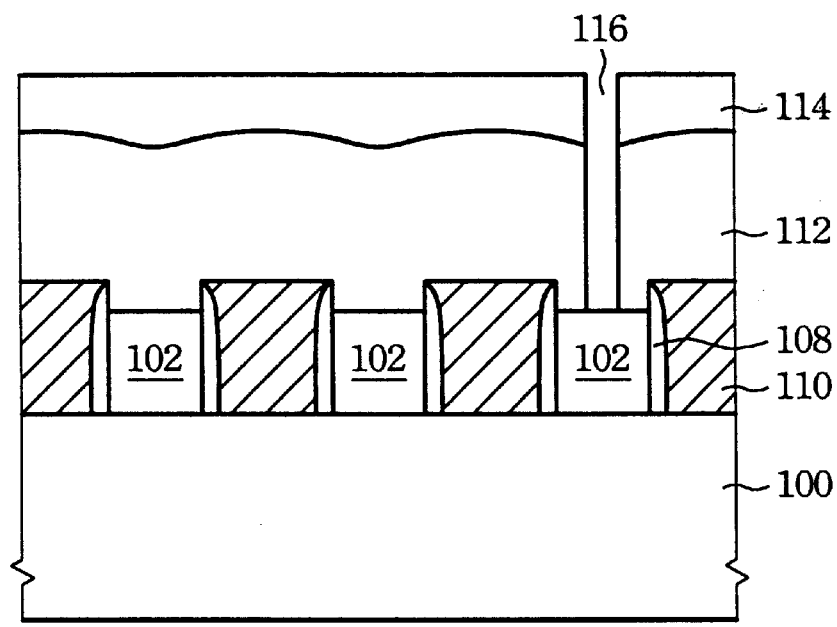
FIG. 11 is a cross-sectional view of a semiconductor wafer illustrating the step of etching the dielectric cap layer and the inorganic dielectric layer to form contact holes according to the present invention.

Next referring to FIG. 10, a dielectric cap layer 114 is formed on the inorganic dielectric layer 112. The dielectric cap layer 114 is generally deposited using conventional plasma enhanced chemical vapor deposition (PECVD) or high-density plasma chemical vapor deposition (HDPCVD). Silicon oxide material such as tetra-ethyl-ortho-silicate-oxide (TEOS-oxide), undoped silicate glass (USG) or silicon-rich oxide (SRO), and so on, can be employed for this dielectric cap layer 114.

After the dielectric cap layer 114 is deposited, a planarization process is carried out. Chemical mechanical polishing (CMP) is a preferable method for this step to polish the dielectric cap layer 114 and provide a global planarization. Finally, a photolithography and an anisotropic etching are preformed. The dielectric cap layer 114 and inorganic dielectric layer 112 are etched, and a contact hole 116 is formed in the inter-metal dielectric layer according to layout design.

By implementing the aforementioned processes of the present invention, a structure of a conductive layer with an inter-metal dielectric layer is fabricated. The fabricated structure comprises a conductive layer 102 formed on a semiconductor substrate 100 and constructed with a plurality of conductive regions with respective sidewalls; dielectric spacers 108 formed on the sidewalls of each conductive region; an organic dielectric layer 110 formed on the semiconductor substrate 100 and filling the regions among those conductive regions; an inorganic dielectric layer 112 formed on the conductive layer 102, the dielectric spacers 108, and the organic dielectric layer 110; a planarized cap layer 114 formed on the inorganic dielectric layer 112.

In accordance with above description, the present invention proposes a method and structure of conductive layer and inter-metal dielectric layer. The parasitic capacitance can be decreased at the same time the thermal conductivity is substantially kept. In the present invention, low dielectric constant organic material is employed to provide isolation within a conductive layer and low dielectric constant inorganic material provide isolation between different conductive layers. The anti-reflective coating layer is held after interconnect patterning to serve as stopping layer during the etching back process of the organic dielectric layer. Thin dielectric spacers can be formed between conductive region and organic dielectric layer instead of the thick dielectric liner. The parasitic capacitance is thus reduced. In addition to the inter-metal dielectric layer between interconnecting lines, the present invention can also be applied to the inter-layer dielectric layer between the underlying electrodes and an interconnecting line.

As is understood by a person who is skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a conductive layer and an inter-metal dielectric layer on a semiconductor substrate, said method comprising:

forming a conductive layer on said semiconductor substrate;

forming an anti-reflection layer on said conductive layer;

etching said anti-reflection layer and said conductive layer to form a conductive structure on said semiconductor substrate, wherein said conductive structure comprises a plurality of conductive regions constructed with respective sidewalls;

forming dielectric spacers on said sidewalls of said conductive regions, wherein said dielectric spacers. are formed of materials selected from the group consisting of tetra-ethyl-ortho-silicate-oxide, undoped silicate glass, and silicon-rich oxide;

forming an organic dielectric layer on said semiconductor substrate, wherein said organic dielectric layer is filled among said conductive regions and isolated from said conductive regions with said dielectric spacers; and forming an inorganic dielectric layer on said organic dielectric layer and said conductive structure.

2. The method according to claim 1, wherein said anti-reflection layer is formed with a thickness of about 500 to 3000 angstrom.

3. The method according to claim 1, wherein said dielectric spacers are formed with a thickness of about 200 to 500 angstrom.

4. The method according to claim 1, wherein said dielectric spacers are formed by the following steps:

forming a dielectric liner on said semiconductor substrate; and etching back said dielectric liner to form said dielectric spacers on said.

5. The method according to claim 1, wherein said organic dielectric layer is formed of polymer.

6. The method according to claim 1, wherein said organic dielectric layer is formed by the following steps:

coating an organic dielectric layer on said semiconductor substrate; and removing a portion of said organic dielectric layer on said conductive structure.

7. The method according to claim 7, wherein said removing step of said organic dielectric layer is performed with said anti-reflection layer as stopping layer.

8. The method according to claim 1 further comprising a step to remove said anti-reflection layer after said organic dielectric layer is formed.

9. The method according to claim 8, wherein said anti-reflection layer is a silicon oxynitride (SiON) layer.

10. The method according to claim 9, wherein said silicon oxynitride (SiON) layer is removing by wet etching using hot solution of phosphoric acid ($H_3PO_4$) as etchant.

11. The method according to claim 1, wherein said inorganic dielectric layer is formed of fluorine-doped silicon oxide.

12. The method according to claim 1 further comprising a step to form a dielectric cap layer on said inorganic dielectric layer.

13. The method according to claim 12, wherein said dielectric cap layer is formed of materials selected from the group consisting of tetraethyl-ortho-silicate-oxide, undoped silicate glass, and silicon-rich oxide.

14. The method according to claim 12 further comprising a step to planarize said dielectric cap layer.

15. A method for manufacturing a conductive layer and an inter-metal dielectric layer on a semiconductor substrate, said method comprising:

forming a conductive layer on said semiconductor substrate;

forming an anti-reflection layer on said conductive layer;

etching said anti-reflection layer and said conductive layer to form a conductive structure on said semiconductor substrate, wherein said conductive structure comprises a plurality of conductive regions constructed with respective sidewalls;

forming a dielectric liner on said semiconductor substrate;

etching back said dielectric liner to form dielectric spacers on said on said sidewalls of said conductive regions; wherein said dielectric spacers are formed of materials selected from the group consisting of tetra-ethyl-orthosilicate-oxide, undoped silicate glass, and silicon-rich oxide;

forming an organic dielectric layer on said semiconductor substrate, wherein said organic dielectric layer is filled among said conductive regions and isolated from said conductive regions with said dielectric spacers; and forming an inorganic dielectric layer on said organic dielectric layer and said conductive structure.

16. The method according to claim 15, wherein said anti-reflection layer is formed with a thickness of about 500 to 3000 angstrom.

17. The method according to claim 15, wherein said dielectric spacers are formed with a thickness of about 200 to 500 angstrom.

18. The method according to claim 15, wherein said organic dielectric layer is formed of polymer.

19. The method according to claim 15, wherein said organic dielectric layer is formed by the following steps:

coating an organic dielectric layer on said semiconductor substrate; and removing a portion of said organic dielectric layer on said conductive structure.

20. The method according to claim 19, wherein said removing step of said organic dielectric layer is performed with said anti-reflection layer as stopping layer.

21. The method according to claim 15 further comprising a step to remove said anti-reflection layer after said organic dielectric layer is formed.

22. The method according to claim 21, wherein said anti-reflection layer is a silicon oxynitride (SiON) layer.

23. The method according to claim 22, wherein said silicon oxynitride (SiON) layer is removing by wet etching using hot solution of phosphoric acid (H3PO4) as etchant.

24. The method according to claim 15, wherein said inorganic dielectric layer is formed of fluorine-doped silicon oxide.

25. The method according to claim 15 further comprising a step to form a dielectric cap layer on said inorganic dielectric layer.

26. The method according to claim 25, wherein said dielectric cap layer is formed of materials selected from the group consisting of tetra-ethyl-ortho-silicate-oxide, undoped silicate glass, and silicon-rich oxide.

27. The method according to claim 25 further comprising a step to planarize said dielectric cap layer.

* * * * *